(12) United States Patent
Hua et al.

(10) Patent No.: US 7,932,136 B2
(45) Date of Patent: Apr. 26, 2011

(54) SOURCE/DRAIN JUNCTION FOR HIGH PERFORMANCE MOSFET FORMED BY SELECTIVE EPI PROCESS

(75) Inventors: Xuefeng Hua, Guilderland, NY (US); Johnathan E. Faltermeier, Delanson, NY (US); Toshiharu Furukawa, Essex Junction, VT (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 379 days.

(21) Appl. No.: 12/109,025

(22) Filed: Apr. 24, 2008

(65) Prior Publication Data
US 2009/0267149 A1    Oct. 29, 2009

(51) Int. Cl.
*H01L 21/00* (2006.01)
(52) U.S. Cl. ........ 438/151; 438/296; 438/289; 438/478; 438/269; 257/247; 257/335; 257/E21.411; 257/E29.261

(58) Field of Classification Search .................. 438/296, 438/151, 289, 478, 269; 257/247, 335, E21.411, 257/E29.261
See application file for complete search history.

(56) References Cited

U.S. PATENT DOCUMENTS

| 6,750,109 B2 | 6/2004 | Culp et al. |
| 2009/0061586 A1 * | 3/2009 | Yu et al. ........................ 438/296 |

* cited by examiner

*Primary Examiner* — Jarrett J Stark
*Assistant Examiner* — Wilner Jean Baptiste
(74) *Attorney, Agent, or Firm* — Joseph P. Abate; Howard M. Cohn

(57) ABSTRACT

In a field effect transistor (FET), halo features may be formed by etching into the surface of a silicon layer followed by a step of growing a first epitaxial silicon (epi-Si) layer on the etched silicon layer. Source (S) and drain (D), as well as S/D extension features may similarly be formed by etching an epitaxial silicon layer, then filling with another epitaxial layer. Source and Drain, and extensions, and halo, which are normally formed by diffusion, may be formed as discrete elements by etching and filling (epi-Si). This may provide a shallow, highly activated, abrupt S/D extension, an optimally formed halo and deep S/D diffusion doping, and maximized improvement of channel mobility from the compressive or tensile stress from e-SiGe or e-SiC.

7 Claims, 5 Drawing Sheets

SOURCE/DRAIN JUNCTION FOR HIGH PERFORMANCE MOSFET FORMED BY SELECTIVE EPI PROCESS

FIELD OF THE INVENTION

The invention relates to semiconductor fabrication and, more particularly to field effect transistors (FETs) and, more particularly to performance-enhancing features such as halos and extensions.

BACKGROUND OF THE INVENTION

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source, gate and drain. In the FET, a small amount of voltage is applied to the gate (G) in order to control current flowing between the source (S) and drain (D). In FETs, the main current appears in a conducting channel formed near (usually primarily under) the gate. This channel connects electrons from the source terminal to the drain terminal. The channel current can be altered by varying the voltage applied to the gate terminal or by widening or narrowing the conducting channel and thereby controlling the current flowing between the source and the drain.

Figure 1:
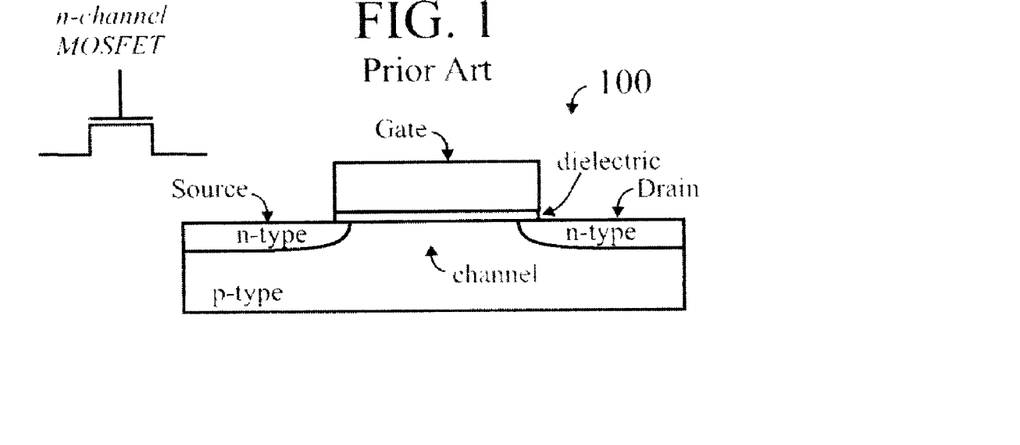
FIGS. 1, 2A and 2B are cross-sectional views of FETs, according to the prior art.

FIG. 1 illustrates a FET 100 comprising a p-type substrate (or a p-well in the substrate), and two spaced-apart n-type diffusion areas—one of which may serve as the "source", the other of which may serve as the "drain" of the transistor. The space between the two diffusion areas is called the "channel". The channel is where current flows, between the source (S) and the drain (D). A schematic symbol for an n-channel MOSFET (or NFET) appears to the left of FIG. 1.

A thin dielectric layer ("dielectric") is disposed on the substrate above the channel, and a "gate" conductor (G) is disposed over the dielectric layer, thus also atop the channel. (The dielectric under the gate is also commonly referred to as "gate oxide" or "gate dielectric".)

Electrical connections (not shown) may be made to the source (S), the drain (D), and the gate (G). The substrate may be grounded or biased at a desired voltage depending on applications.

Generally, for NFET as an example, the drain (D) is biased positive and source (S) at ground, and when there is no voltage applied to the gate (G), there is no electrical conduction (connection) between the source (S) and the drain (D). As positive voltage is applied to the NFET gate, there is a "field effect" in the channel between the source and the drain, and current can flow between the source and the drain. This current flowing in the channel can be controlled by the voltage applied to the gate. In this manner, a small signal (gate voltage) can control a relatively large signal (current flow between the source and the drain).

The FET 100 is exemplary of a MOSFET (metal oxide semiconductor FET) transistor. With the specified "n" and "p" types shown above, an "n-channel MOSFET" can be formed. With opposite polarities (swapping "p" for "n" in the diffusions, and "n" for "p" in the substrate or well), a p-channel FET can be formed. In CMOS (complementary metal oxide semiconductor), both n-channel and p-channel MOS transistors are used, often paired with one another.

While particular n- and p-type dopants are described herein according to NMOS technology, it is to be appreciated that one or more aspects of the present invention are equally applicable to forming a PMOS (generally, simply by reversing the n- and p-type dopants).

An integrated circuit (IC) device may comprise many millions of FETs on a single semiconductor "chip" (or "die"), measuring only a few centimeters on each side. Several chips may be formed simultaneously, on a single "wafer", using conventional semiconductor fabrication processes including deposition, doping, photolithography, and etching.

Shallow Trench Isolation

Figure 2A:
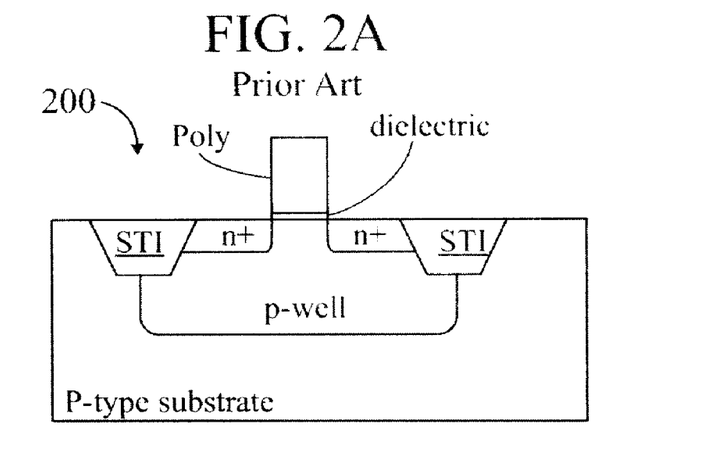

FIG. 2A illustrates a FET 200, similar to the FET 100 shown in FIG. 1. In FIG. 2A, a well, in this case a p-well is shown. The source and drain diffusions are both n+, having a polarity which is opposite to that of the well, and the channel. In FIG. 2A, shallow trench isolation (STI) is shown, surrounding the FET (NFET).

To form STI, generally, a trench is etched into the substrate and filled with an insulating material such as oxide, to isolate one region of the substrate from an adjacent region of the substrate. One or more transistors (such as FETs) of a given polarity (NFET or PFET) may be disposed within a given area isolated by STI.

The shallow trench, as its name implies, for a given width is generally not as deep as a "deep trench". For example, a deep trench may have a depth of approximately 2000-5000 nm (2-5 microns) and a width "W" of approximately 50-175 nm. Therefore, a deep trench is usually much deeper than it is wide, having an aspect ratio (depth-to-width) of approximately 40:1. Shallow trenches, such as are used for STI, may have a depth of approximately 20-300 nm and a width of at least 10 nm (they can generally be as wide as desired), resulting in an aspect ratio (depth-to-width) of approximately at most 3:1, more typically 2:1 or lower, such as 1:1.

Short Channel Effect, Halo and S/D Extension Implants

The reverse short-channel effect is a secondary effect describing the reduction in threshold voltage (Vt) in MOSFETs with non-uniformly doped channel regions as the gate length decreases. Since drive current is determined by Vt, shorter channel devices lose some driving ability. Reverse short channel effect (RSCE) is a result of non-uniform channel doping (halo doping) in modern processes. To combat drain-induced barrier lowering (DIBL), MOSFET channels are more doped near the source (S) and drain (D) terminals to reduce the size of the depletion region in the vicinity of these junctions (called halo doping to describe the limitation of this halo doping to the immediate vicinity of the junctions). At short channel lengths the halo doping of the source overlaps that of the drain, increasing the average channel doping concentration, and thus increasing the threshold voltage. This increased threshold voltage requires a larger gate voltage for channel inversion. However, as channel length is increased, the halo doped regions become separated and the doping mid-channel approaches a lower background level dictated by the body doping. This reduction in average channel doping concentration means Vt initially is reduced as channel length increases, but approaches a constant value independent of channel length for large enough lengths.

Ion implanting, in general is the process of introducing impurities such as dopants into the semiconductor substrate, or elements formed on the semiconductor substrate, and is often performed with a mask (or previously-formed elements in place) so that only certain areas of the substrate will be doped, or implanted. For example, doping is used to form the source and drain regions of an FET. An ion implanter is typically employed for the actual implantation.

Halo implants are well known as a means of moderating drain induced barrier lowing (DIBL) effects in very short MOSFETs. Conventionally, the halo implant is performed with the wafer tilted so that the implanted ions penetrate underneath the gate beyond the extent of the source/drain extension implant. The halo implant may be of the same polarity as the channel, and opposite polarity from the source/drain (S/D) implants.

Symmetric and asymmetric halo implants have been suggested to improve performance of low power short channel length field effect transistors (FET) by improving resistance to DIBL. Symmetric halo implants are pockets of increased dopant concentration of the same conductivity type as the channel region in areas adjacent to the FET source and drain edges. Each of these FET halo implants is doped opposite to the adjacent source/drain diffusion. Asymmetric halo implants extend normally adjacent to the drain but also they may extend differently adjacent the source than adjacent the drain. Halo implants may also extend into or under the channel region adjacent the source or drain edges. See U.S. Pat. No. 6,750,109 (IBM, 2004).

Source/Drain (S/D) "extension" implants are also well known. A S/D extension may be of the same polarity as the source/drain (S/D) implants, and opposite polarity from the channel. Generally, the S/D extension implants are located above (closer to the substrate surface) than the halo implants, and may extend from an inner edge of the respective source and drain diffusions. The extension doping areas overlap with gate conductor.

Figure 2B:
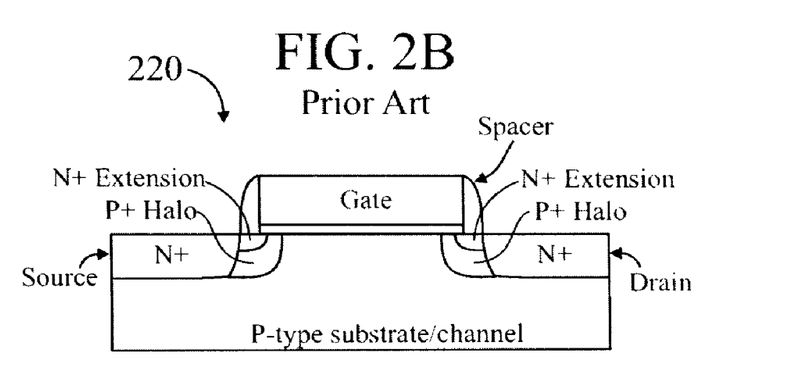

FIG. 2B illustrates a FET 220, similar to the FET 100 shown in FIG. 1. In FIG. 2B, the substrate (or cell well) and channel are p-type. The source and drain diffusions are both n-type (n+), having a polarity which is opposite to that of the well, and the channel, which is p-type.

In FIG. 2B, p+ halo implants are shown, as well as n+ extensions of the source/drain implants (or diffusions).

In FIG. 2B, sidewall spacers ("spacer") are shown on sides of the gate stack ("gate"). Generally, the purpose of sidewall spacers is to control the location and extent of (by blocking) subsequent implants. For example, sidewall spacers disposed on opposite sides of a gate electrode structure cause subsequent implants to occur further away from the gate than otherwise (without the spacers in place), thereby controlling (increasing) the overlap length of a extension under the gate electrode structure.

Silicon nitride (Si3N4) and silicon oxide (SiO2) is a common spacer material. Spacers can be used for various purposes, such as controlling the location of halo implants, source/drain extensions and S/D diffusion.

Stress Layers, Electron and Hole Mobility

In some cases mechanical stress can be used advantageously to improve carrier mobility in a semiconductor device such as MOSFET (metal oxide semiconductor field effect transistor). For an NFET, tensile stress induced by a layer, such as epitaxial silicon-carbon (e-SiC) may cause the mobility of electrons to decrease. On the other hand, when the CMOS device being formed is a PFET, the compressive stress caused by the e-SiGe causes the mobility of the holes to increase.

Integration of Processes Features and Components

It is becoming increasingly difficult to integrate all of the necessary components (such as halo implants and source/drain extensions) to form the junction for the high performance CMOSFET by conventional ion implant followed by high temp thermal activation. Particularly, integration with epitaxial silicon-germanium (e-SiGe) is challenging. For example, the temperature required for e-SiGe process (500° C.-700° C.) may crystallize the amorphous Si formed by pre-amorphization implant (PAI), may diffuse the dopant by TED (Transient Enhanced Diffusion) and also may prevent the maximum activation by the high temp activation anneal such as laser anneal.

On the other hand, to preserve beneficial stress created by e-SiGe, PAI and high temperature anneal after e-SiGe formation is not a good process, because they create defects, particularly dislocations which relax the stress.

SOI Substrates

Silicon on insulator technology (SOI) refers to the use of a layered silicon-insulator-silicon substrate in place of conventional silicon substrates in semiconductor manufacturing, especially microelectronics. SOI-based devices differ from conventional silicon-built devices in that the silicon junction is above an electrical insulator, typically silicon dioxide or (less commonly) sapphire.

SUMMARY OF THE INVENTION

According to the invention, generally, instead of conventional ion implantation followed by high temperature anneal to form S/D extension, halo, S/D, they are formed by in situ doped selective Si, SiGe and SiC epi process.

According to an embodiment of the invention, a method of forming a field effect transistor (FET) may include: forming a gate (G) stack atop a silicon layer, the silicon layer having a surface; forming halo features by etching into the surface of the silicon layer followed by a step of growing a first epitaxial silicon (epi-Si) layer on the etched silicon layer; and forming a source (S) on one side of the gate (G) and a drain (D) on an opposite side of the gate (G). The silicon layer may be a layer of silicon (SOI) disposed atop a buried oxide (BOX) layer or a bulk silicon substrate. The step of etching into the surface of the silicon layer may include: first etching a first distance into the surface of the silicon layer; and then etching a second distance into the surface of the silicon layer; wherein a first void space is formed extending from the surface of the silicon layer a total of the first distance and the second distance into the surface of the silicon layer; and wherein first recesses for the halo features are formed extending under the gate stack from opposite sides of the gate stack, between the first distance and the second distance. The step of growing a first epitaxial silicon layer may include: filling the first void space and the first recesses. The method may further include: in situ doping the first epitaxial silicon layer to have a same polarity as the silicon layer. The method may further include: etching the first epitaxial silicon layer and forming a second void space so that first epitaxial silicon material remains only in recesses, as the halo features. The method may further include: growing a second epitaxial silicon layer to fill the second void space; and in situ doping the second epitaxial silicon layer to have a polarity opposite from the first epitaxial silicon layer, which will constitute the source (S) and drain (D). The method may further include: etching the second epitaxial silicon layer to form a third void extending into the surface of the second epitaxial layer and forming second recesses extending under the gate stack from opposite sides of the gate stack. The second recesses may be located closer to the gate stack than the first recesses. The method may further include: growing a third epitaxial silicon layer to fill the third void; and in situ doping the third epitaxial silicon layer to have a same polarity as the silicon layer. The method may further include: forming sidewall spacers on the gate stack and siliciding. A hard mask may be disposed over the gate stack is in place during all of the epitaxial silicon growing steps and is removed prior to siliciding.

According to an embodiment of the invention, a method of forming a field effect transistor (FET) in a silicon layer may include: forming a gate stack on the silicon layer; and forming halo features by etching the silicon layer and a first in situ doped epitaxial silicon growth; forming source and drain features by etching the first epitaxial silicon and performing a second in situ doped epitaxial silicon growth. S/D extension features may be formed by etching the second epitaxial silicon and performing a third in situ epitaxial silicon growth.

According to an embodiment of the invention, a field effect transistor (FET), may include: a substrate having a silicon surface; a gate stack disposed on the surface; source (S) and drain (D); and halo features disposed a first distance below the gate stack which are discrete deposited structures formed by etching and filling. The source (S) and drain (D) may be discrete deposited structures formed by etching and filling. S/D extension features may be disposed a second distance below the gate stack which are discrete deposited structures formed by etching and filling. The substrate may be a silicon-on-insulator (SOI) substrate; wherein the silicon surface is a layer of silicon disposed atop a buried oxide (BOX) layer.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that the edges may not be so straight, and the intersections may be rounded, due to the nature of the processes (such as etching) used to form the various elements of the semiconductor devices.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

In the drawings accompanying the description that follows, both reference numerals and legends (labels, text descriptions) may be used to identify elements. If legends are provided, they are intended merely as an aid to the reader, and should not in any way be interpreted as limiting.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO2$. For example, silicon nitride (stoichiometrically $Si3N4$, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

As used herein, the term semiconductor fabrication or process or device may refer to standard CMOS processing and devices. CMOS is a widely used type of semiconductor product that uses both NMOS and PMOS devices and circuits.

As mentioned above, it is becoming increasingly difficult to integrate all the necessary components for the high performance CMOSFET by conventional ion implant followed by high temp thermal activation.

The process described herein, circumvents those processes, while providing for the formation of a high performance CMOSFET device which may have one or more of the following features:

1) a shallow, highly activated, abrupt S/D extension,
2) optimally formed halo and deep S/D diffusion in situ doping,
3) maximized improvement of channel mobility from the compressive or tensile stress from e-SiGe or e-SiC.

An exemplary process of forming a high performance CMOSFET with halo and extension features is illustrated in FIGS. 3A-3H, and will be described in the context of forming an NFET. It should be understood that alternate dopings and implants could be used to form a complementary PFET.

Figure 3A:
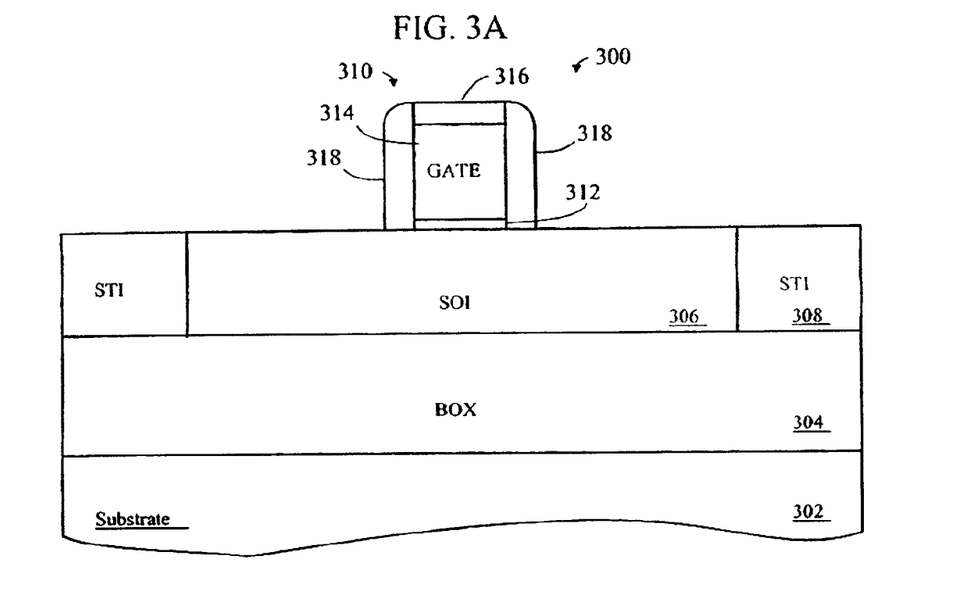
FIGS. 3A-3H are cross-sectional views of an embodiment of a process of forming a FET, according to the invention.

FIG. 3A illustrates a first step (STI, well formation, gate stack, spacers) in the process. The process is illustrated and described in the context of an overall substrate 300 which is an SOI-type substrate (or wafer) having a layer 306 of silicon ("SOI") disposed atop a buried oxide (BOX, insulator) layer 304, which is disposed atop an underlying substrate 302 which may be a silicon substrate. The BOX layer 304 may have a thickness of 500-2500 Å (50-250 nm). The silicon (SOI) layer 306 may have a thickness of 200-1300 Å (20-130 nm). Pad oxide and pad nitride layers which may initially be present on the substrate are omitted, for illustrative clarity. In subsequent views, the underlying substrate 302 is omitted, for illustrative clarity.

Shallow trench isolation (STI) 308 may be formed, in a conventional manner, by etching the SOI 306 and filling the trench with oxide. Both the BOX 304 and the STI 308 are oxide.

For an NFET, a p-well (not shown) may be formed, in the SOI 306, generally at the bottom of the SOI 306. In subsequent views, the well is omitted, for illustrative clarity.

A conventional gate stack 310 may be formed, comprising a gate dielectric 312, and a gate electrode (conductor) 314. The gate dielectric 312 may be a high-k dielectric such as hafnium oxide (HfO2), and the gate conductor may be a metal such as titanium nitride (TiN). The gate stack 310 is formed on a surface of the SOI layer 306. A hard mask 316 is shown over the gate conductor 314. The hard mask 316 is used to prevent epi growth on the top of the gate and is removed before silicide, as described hereinbelow.

A "disposable" spacer 318 may be formed on the sides of the gate stack 310. The spacer 318 may be nitride (Si3N4), and may have an exemplary thickness of approximately 5-20 nm. The spacer 318 is disposable in the sense that it may be modified (thinned) or replaced, in a subsequent step.

Figure 3B:
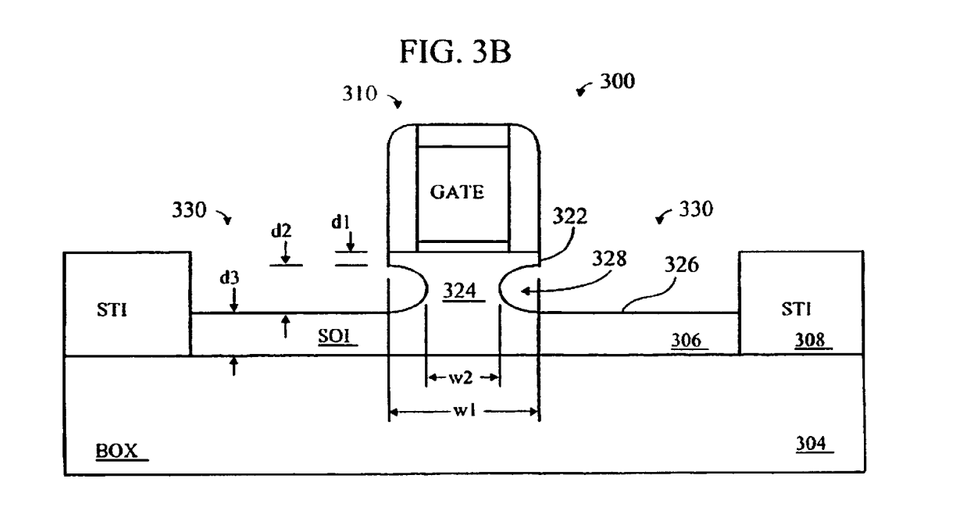

Some exemplary dimensions for the beginning structure shown may be:
width (distance) between the STIs 308, approximately 50-1000 nm (pitch size)
width of the gate conductor 314, approximately 10-100 nm
height of the gate conductor 314, approximately 50-100 nm
width of the spacers 318, approximately 5-20 nm FIG. 3B illustrates a next step (controlled Si etch) in the process. Generally, a first directional (anisotropic) etch is performed, followed by a second non-directional (isotropic) etch. Both etches may be performed by reactive ion etching (RIE).

The first etch is selective to silicon, and etches down (vertically) into the SOI 306 a distance d1, leaving an upper (top) central portion 322 of the SOI 306 under the gate stack 310 substantially unaltered. This central portion 322 of the SOI 306 will have a thickness equal to d1, and may have a width w1 (horizontal, as shown) which is substantially equal to the width of the gate stack 310 plus spacers 318.

The next etch is also selective to silicon, and continues to etch down into the SOI 306 a distance d2, as well as undercutting (going under) the central portion 322. Recesses (voids, depressions) 328 are formed, extending horizontally into the SOI 306 under the central portion 322, in a middle, central portion 324 of the SOI layer 306 by isotropic etching.

The distance d2 may be greater than the distance d1. The total of the two etches extends a distance d1+d2 into the surface of the SOI substrate 306. The recesses 328 are located at a depth between d1 and d2, and extend partially under the gate stack 310 from opposite sides of the gate stack 310.

After the etch (or two etches), the middle portion 324 of the SOI layer 306 may have a width of w2 (horizontal, as shown), which is less than the width w1 of the upper portion 322. Generally, this narrowing of the SOI 306 under the top portion will be symmetric, left and right, but the process may be altered so that it is asymmetric, if desired.

This leaves a lower (bottom) portion 326 of the original SOI 306 which is substantially thinned out, having a thickness of d3. As illustrated, the lower portion 326 has a substantially planar top surface. This etch step leaves (forms) a void space 330, including the aforementioned recesses 328 under the gate stack 310.

The void space 330 extends into the SOI layer 306, from the surface thereof. Where the SOI layer 306 is covered by gate stack 310 and spacers 318, the SOI layer is not etched. However, this etch step also creates recesses 328 in the SOI 306, on (under) either side of the gate stack 310, in the middle portion 324 of the SOI 306, commencing from a distance d1 below the surface of the SOI layer 306 and continuing to the distance d2 below the surface of the SOI layer 306. In a subsequent step, these recesses will be filed with in situ doped epi-Si (epitaxially grown silicon), which will serve as halo features for the FET. Notice that there remains an un-recessed portion 322 of the SOI 306 above the recesses 328, and in a subsequent step, smaller recesses will be formed there too and filled with in situ doped epi-Si to form extension features for the FET.

By way of example, the original thickness of the SOI 306 (which will equal d1+d2+d3) may have been 80 nm, and the remaining dimensions, after this etch step may be:
d1=10 nm
w1=40 nm
d2=50 nm
w2=10 nm
d3=20 nm The recesses 328 each extend horizontally into the middle portion 324 a distance which is (w1−w2)/2, such as 15 nm.

Figure 3C:
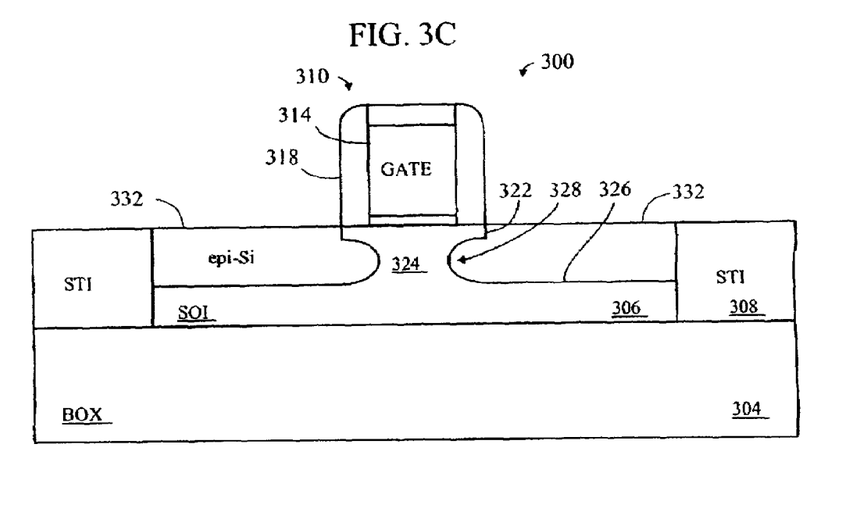

FIG. 3C illustrates a next step (epi, in situ doping) in the process. Epitaxial silicon (e-Si) 332 is grown in the void space 330 (FIG. 3B), including in the halo recesses 328, and may be in-situ boron (B) doped, such as to a concentration of approximately 1e18 to 1e19 atoms/cm2. Note that this doping is "p", or electron acceptor, the same as the well. Other p-types, such as indium (In) could be used. Although the epi-Si "fill" 332 is shown extending only to the original top surface of the substrate, it could extend higher, beyond the surface.

Figure 3D:
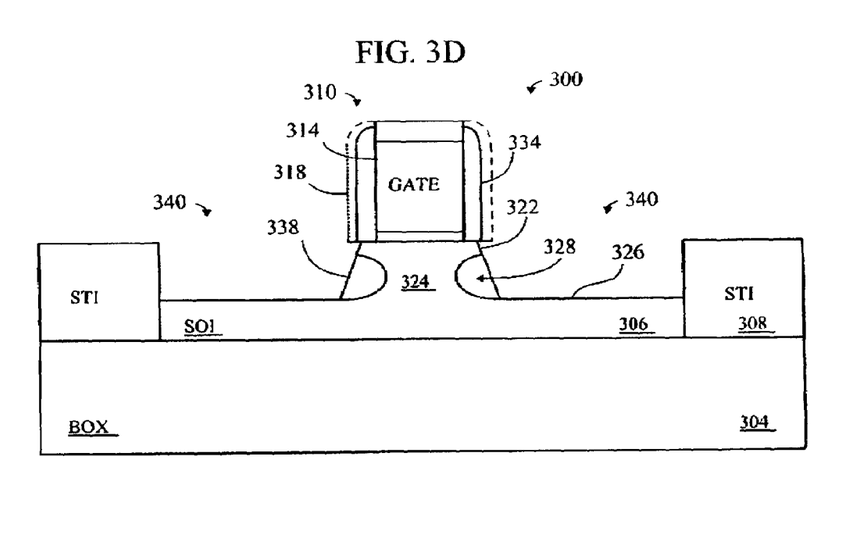

FIG. 3D illustrates a next step (controlled Si etch) in the process. First, the original spacer 318 (shown in dashed lines) is thinned, or it is removed and a new spacer 334 is formed. The new spacer 334 is thinner than the original spacer 318, may be nitride, and may have a thickness of less than 10 nm.

Then, the epi-Si filler 332 is etched, to remove substantially all of the doped epi-Si 332 except for portions 338 which remains in the recesses 328. These remaining doped portions 338 of the epi-Si 332 will serve as halo features, and are disposed beneath the gate stack 310 on either side of the gate stack. In contrast with prior art halo implants which typically exhibit gradients, these features 338, which are distinct deposited structures, exhibit distinct borders.

This etch step may also etch some of the underlying SOI 306, such as the lower portion 326. Also, note that this etch step is shown as proceeding at an angle from vertical, but it could be vertical. Also note that in this etch step, the upper SOI portion 322 under the spacer 334 may be slightly undercut.

This etch step creates a new void space 340 (compare 330, FIG. 3B), which will be filled with in situ doped epi-Si in a subsequent step. Because it is intended that this etch step (FIG. 3D) remove all of the previously deposited epi-Si 332 (except for portions 338 remaining in the recesses 328), it should be slightly deeper than the previous (FIG. 3B) etch step, such as 55 nm instead of 50 nm.

Figure 3E:
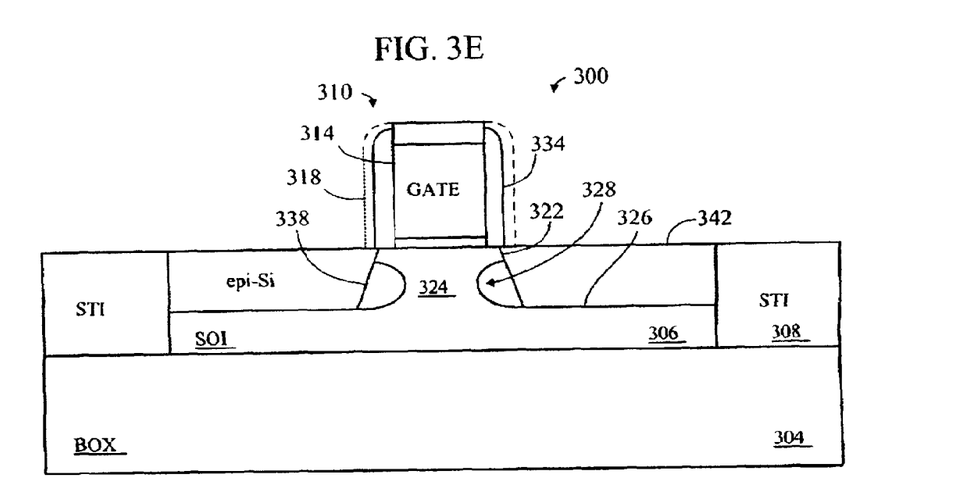

FIG. 3E illustrates a next step (epi, in situ doping) in the process. Epitaxial silicon (e-Si) 342 is grown in the void space 340 (FIG. 3D), to fill the void space 340, and may be in-situ arsenic (As) doped, such as to a concentration of approximately 1e20 atoms/cm2. Note that this doping is "n", or electron donor, opposite from the p-type well. Other n-types, such as phosphorous (P) or antimony (Sb), could be used. Additionally, the in situ doping may include carbon (C), with a concentration of approximately 1e18 atoms/cm2. Although the epi-Si "fill" 342 is shown extending only to the original top surface of the substrate, it could extend higher, beyond the surface. Generally, the carbon (C) is for tensile stress, and for PFET Ge may be used for compressive stress.

Figure 3F:
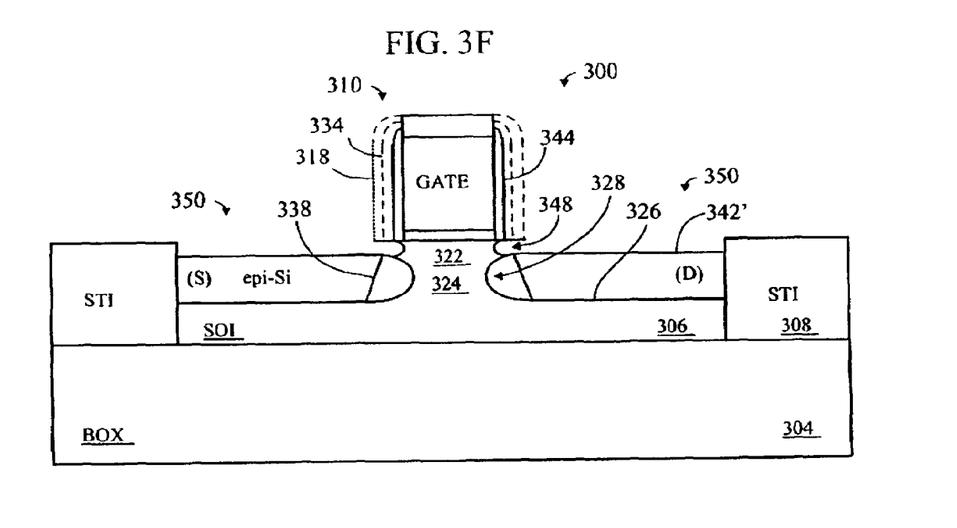

FIG. 3F illustrates a next step (controlled Si etch) in the process. First, the previous spacer 334 (shown in dashed lines) is thinned, or it is removed and a new spacer 344 is formed. The new spacer 344 is thinner than the previous spacer 334, may be nitride, and may have a thickness of approximately less than 20 nm.

Then, the epi-Si fill 342 is etched. Generally, a first directional (anisotropic) etch is performed, followed by a second non-directional (isotropic) etch. Both etches may be reactive ion etching (RIE). The overall etch depth may be approximately less than 15 nm, or approximately equal to d1 (the thickness of the upper portion 322 of the SOI 306, refer to FIG. 3B). In this etch step, the epi-Si 342 is thinned, slightly, and is therefore designated 342' (prime.)

As will become evident, the two portions of epi-Si 342' on the respective two (left and right, or "opposite") sides of the gate stack may serve as source (S) and drain (D) for the FET 300. In a manner similar to the halo features 338 being discrete deposited structures formed by etching and filling (and in situ doping), the source (S) and drain (D) are similarly discrete deposited structures formed by etching and filling (and doping).

In this etch step, the upper portion 322 of the SOI 306 under the spacer 344 may be slightly undercut, forming a horizontal recess 348 (compare the halo recess 328), extending approximately 8 nm into the upper portion 322 of the SOI 306.

This etch step creates a new void space 350 (compare 330 in FIG. 3B, or 340 in FIG. 3D), extending into the surface of the second epitaxial layer 342 and forming recesses 348 extending under the gate stack 310 from opposite sides of the gate stack. These recesses 348 will be filled with epi-Si in a subsequent step. Note that the second (S/D extension) recesses 348 are located closer to the gate stack than the first (halo) recesses 328.

Figure 3G:
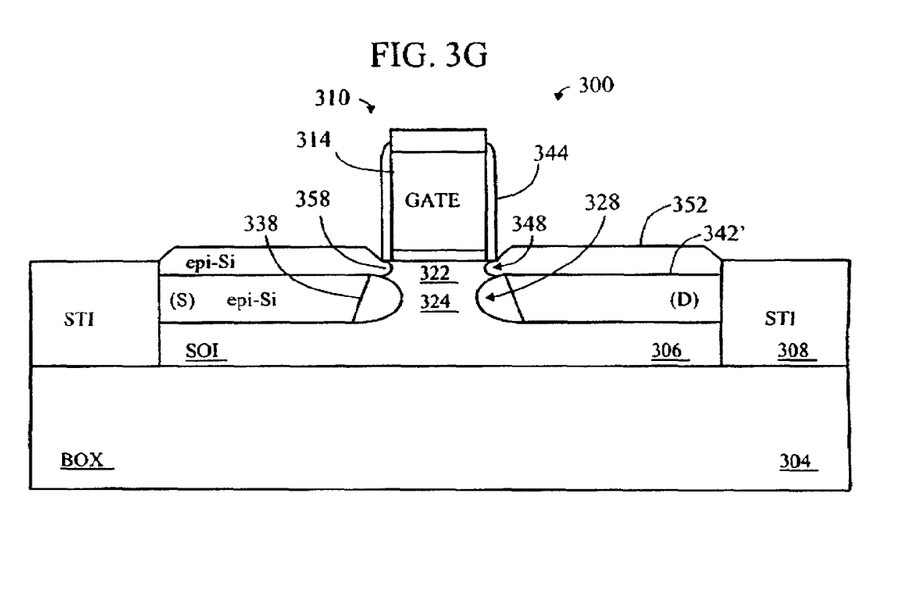

FIG. 3G illustrates a next step (epi, in situ doping) in the process. Epitaxial silicon (e-Si) 352 is grown over the previous layer 342' of epi-SI, and may be in-situ arsenic (As) doped, such as to a concentration of approximately 1e20 atoms/cm$^3$. Note that this doping is "n", or electron donor, opposite to the well. Other n-types, such as phosphorous (P) or antimony (Sb), could be used. Additionally, the in situ doping may include carbon (C), with a concentration of approximately 1e18 atoms/cm$^3$. In this case, the epi-Si "fill" 352 is shown extending to higher than the original top surface of the substrate, which may be useful to keep silicide away. Again, carbon (C) may be included for stress.

Note that the epi-Si 352 fills the recesses 348 which are in the top portion 322 of the SOI 306, under the spacers 344. The epi-Si 358 in the recesses 348 will serve as "extension features" for the FET. In a manner similar to the halo features 338 and the source (S) and drain (D) being discrete deposited structures formed by etching and filling (and in situ doping), the S/D extension features 358 are similarly discrete deposited structures formed by etching and filling (and in situ doping). As with the "halo features" 338, this forming of the halo and extension features as distinct structural elements (doped epi-Si filling recesses) avoids problems associated with diffusion associated with implanted halo and extension features. Note also that the hard mask 316 is still atop the gate stack. The hard mask will be removed, and the spacer replaced with a thicker spacer, before silicide (next step).

Figure 3H:
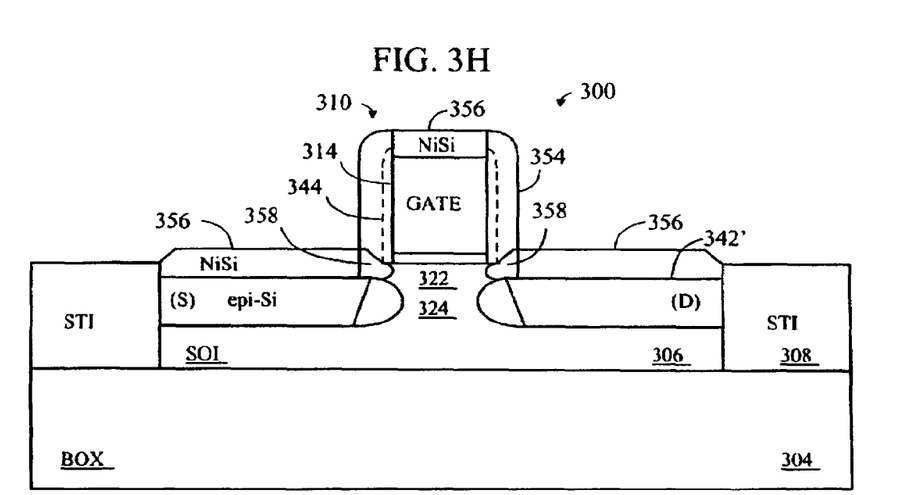

FIG. 3H illustrates a next (or final) step (silicide) in the process. A new, thicker spacer 354 is formed. The new spacer 354 may be formed over the previous spacer 344, and has a thickness sufficient to keep subsequent silicide away from the gate. The spacer 354 may have a thickness of approximately 15-30 nm.

Next, silicide (NiSi) is formed, to serve as a contact material. Silicide 356 is shown over the gate conductor 314, and over the two portions of epi-Si 342' serving as source (S) and drain (D) for the FET 300.

Although not shown, a stress nitride layer may be added, such as 40 nm thick on top of the silicide and around the gate stack.

Although not shown, it will be understood that interlevel dielectric (ILD), contacts holes and metal wiring may be added, to complete device formation There has thus been shown an example of an FET formed in an SOI substrate, forming the following elements, which are normally formed by diffusion, as discrete elements by etching and filling (epi-Si):

source (S) and drain (D)
halos 338
S/D extensions 358

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. A method of forming a field effect transistor (FET) comprising:
   forming a gate (G) stack atop a silicon layer, the silicon layer having a surface;

forming halo features by etching into the surface of the silicon layer followed by a step of growing a first epitaxial silicon (epi-Si) layer on the etched silicon layer;

forming a source (S) on one side of the gate (G) and a drain (D) on an opposite side of the gate (G), wherein the step of etching into the surface of the silicon layer comprises:

first etching a first distance into the surface of the silicon layer;

then etching a second distance into the surface of the silicon layer;

forming a first void space extending from the surface of the silicon layer a total of the first distance and the second distance into the surface of the silicon layer;

forming first recesses for the halo features extending under the gate stack from opposite sides of the gate stack, between the first distance and the second distance;

filling and in situ doping the first void space and the first recesses;

etching the first epitaxial silicon layer and forming a second void space so that first epitaxial silicon material remains only in recesses, as the halo features;

growing a second epitaxial silicon layer to fill the second void space; and etching the second epitaxial silicon layer to form a third void extending into the surface of the second epitaxial layer and forming second recesses extending under the gate stack from opposite sides of the gate stack.

2. The method of claim 1, further comprising:
in situ doping the first epitaxial silicon layer to have a same polarity as the silicon layer.

3. The method of claim 1, further comprising:
in situ doping the second epitaxial silicon layer to have a polarity opposite from the first epitaxial silicon layer, which will constitute the source (S) and drain (D).

4. The method of claim 1, including:
locating the second recesses closer to the gate stack than the first recesses.

5. The method of claim 4, further comprising:
growing a third epitaxial silicon layer to fill the third void; and
in situ doping the third epitaxial silicon layer to have a same polarity as the second epitaxial silicon layer.

6. The method of claim 5, further comprising:
forming sidewall spacers on the gate stack and siliciding.

7. The method of claim 6, including:
disposing a hard mask over the gate stack and keeping it in place during the growing of the first, second and third epitaxial silicon layers; and
removing the hard mask prior to siliciding.

* * * * *